United States Patent [19]

Morii

[11] 3,852,686

[45] Dec. 3, 1974

[54] AUTOMATIC FREQUENCY CONTROL CIRCUIT

[75] Inventor: Kokichi Morii, Chigasaki, Japan

[73] Assignee: Sony Corporation, Tokyo, Japan

[22] Filed: Nov. 21, 1973

[21] Appl. No.: 417,782

[30] Foreign Application Priority Data

Nov. 25, 1972 Japan .............................. 47-135637

[52] U.S. Cl. ........ 331/177 V, 331/36 C, 331/117 R, 332/30 V, 334/15

[51] Int. Cl. ................................................ H03c 3/22

[58] Field of Search ......... 334/15; 331/36 C, 177 V, 331/117; 332/30 V

[56] References Cited

UNITED STATES PATENTS

| | | | |
|---|---|---|---|
| 3,332,035 | 7/1967 | Kovalevski | 331/36 C |
| 3,469,214 | 9/1969 | Sasaki et al. | 331/36 C |
| 3,619,803 | 11/1971 | Klein | 331/177 V |
| 3,626,311 | 12/1971 | Kraybill | 331/36 C |

*Primary Examiner*—John Kominski
*Attorney, Agent, or Firm*—Alvin Sinderbrand; Lewis H. Eslinger

[57] ABSTRACT

An automatic frequency control circuit includes a transistor, an L-C resonant circuit connected to the transistor to form an oscillator and a varicap diode which is supplied with an automatic frequency control voltage signal and is reverse biased by a bias voltage received from the collector electrode of the transistor. The bias voltage provided by the transistor is constant so that the varicap diode is inhibited from performing a rectifying operation on the oscillating signal produced by the oscillator.

5 Claims, 6 Drawing Figures

AUTOMATIC FREQUENCY CONTROL CIRCUIT

BACKGROUND OF THE INVENTION

The present invention relates generally to an automatic frequency control circuit, and more particularly to an automatic frequency control circuit which is suitable for use with an FM radio receiver.

A typical prior art circuit that is adapted for use in an FM radio receiver employs a voltage-variable capacitance element connected in circuit with a resonant circuit to vary the resonant frequency of the resonant circuit in accordance with a control voltage applied thereto. One such voltage-variable capacitance element that has been used is the varicap diode. However, if a varicap diode is connected to a resonant circuit, such as an L-C oscillating circuit, the possibility exists that the oscillating voltage produced by the resonant circuit will forward bias the varicap diode, resulting in a rectifying operation performed thereby. Such rectifying operation tends to deleteriously affect the automatic frequency control operation.

In an attempt to overcome this problem attending the use of varicap diodes in automatic frequency control circuits, the prior art has suggested the application of an essentically constant reverse bias voltage to the varicap diode. By reverse biasing the varicap diode in this manner, it is believed, the affects on automatic frequency control operation by diode rectification can be minimized. The reverse bias voltage is produced by a zener diode connected, for example, to the cathode of the varicap diode to thus provide an essentially constant reverse bias voltage across the varicap diode. However, a circuit employing a zener diode is relatively expensive. Moreover, a zener diode presents a source of unwanted noise, thus necessitating compensating circuitry, such as a very large capacitor to shunt the noise signals. This also adds to the expense of an automatic frequency control circuit.

Alternatively, if the zener diode is replaced by a resistor to reverse bias the varicap diode, changes in the energizing voltage produced by the circuit power source will result in corresponding changes in the reverse bias voltage. Hence, the oscillating frequency of the automatic frequency control circuit may be subjected to undesired drift.

SUMMARY OF THE INVENTION

Therefore it is an object of the present invention is to provide an improved automatic frequency control circuit which is free from the drawbacks of the prior art and that is readily adapted for use with a receiver.

Another object of the present invention is to provide an automatic frequency control circuit including a varicap diode which is reversely biased by a constant voltage.

A further object of the present invention is to provide an automatic frequency control circuit in which the transistor of an oscillating circuit is used to provide a constant voltage because of its collector-base negative feedback, and a varicap diode is reversely biased by the constant voltage to eliminate an undesirable rectification operation on an oscillator output signal.

A yet further object of the present invention is to provide an inexpensive AFC circuit which is simple in construction and need not be provided with an expensive zener diode as heretofore suggested.

In accordance with the present invention, an AFC circuit is provided with an L-C resonant circuit connected to a transistor to form an oscillator circuit, the transistor being provided with an energizing potential; a varicap diode is connected in AC parallel relationship to the capacitor element of the L-C resonant circuit and is further connected to the collector electrode of the transistor to receive a reverse bias voltage therefrom; a frequency controlling signal is supplied to the varicap didode to vary the capacitance thereof, whereby the oscillating frequency of the oscillating circuit is correspondingly varied. A DC feedback path between the collector and base electrodes of the transistor maintains a substantially constant collector voltage.

In one preferred embodiment, the transistor and the L-C resonant circuit are connected to form a Hartley-type oscillator. In this configuration the collector electrode of the transistor is coupled to the varicap diode and is further coupled to a power supply by a first resistor. A second resistor comprises the DC feedback path to interconnect the collector and base electrodes of the transistor.

In another preferred embodiment, the transistor and the L-C resonant circuit are connected to form a Colpitts-type oscillator.

BRIEF DESCRIPTION OF THE DRAWINGS

The forthcoming detailed description of the present invention will best be understood in conjunction with the following drawings in which.

DESCRIPTION OF THE PRIOR ART

Figure 1:
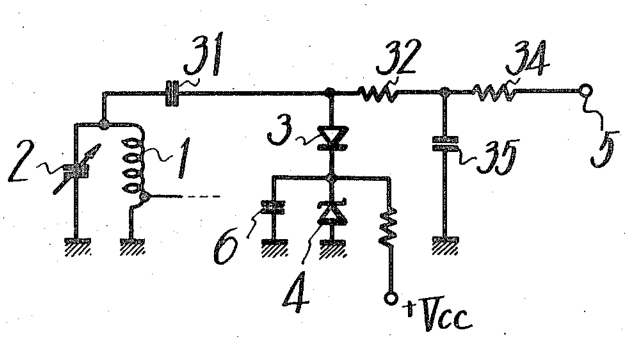
Fig-1 PRIOR ART
FIG. 1 is a circuit diagram of a prior art AFC circuit.

A prior art AFC circuit which is used in an FM radio receiver will now be described with reference to FIG. 1. In FIG. 1, reference numerals 1 and 2 designate a tuning coil and a tuning capacitor of an oscillating circuit of the radio receiver. One end of the parallel connected tuning coil and tuning capacitor as connected to ground and the other end is connected through a coupling capacitor 31 to one terminal of a varicap diode 3. The other terminal of the varicap diode is connected to ground through a constant voltage diode 4 such as a zener diode. The junction between the diodes 3 and 4 is connected to a power source of energizing voltage +Vcc and is also connected to ground through a capacitor 6. The capacitor is provided for eliminating noise. The junction between the capacitor 31 and the varicap diode 3 is connected through series resistors 32 and 34 to an AFC signal input terminal 5, and the junction between the resistors 32 and 34 is connected to ground through a capacitor 35. In this circuit, the resistor 34 and the capacitor 35 form a low pass filter which may eliminate high frequency components contained in an AFC voltage signal applied to the input terminal 5.

In the circuit of FIG. 1, when an AFC voltage is applied to the input terminal 5, the capacitance of the varicap diode 3 is varied in proportion to the AFC voltage signal to effect a variation in the oscillating frequency of the oscillating circuit, thereby performing an AFC operation. The constant voltage diode 4 is provided for reversely biasing the varicap diode 3 so as to inhibit rectification by the varicap diode 3 of an oscillating voltage (generally, about 7 volts peak-to-peak) obtained across the coil 1 and the capacitor 2, which rectification would deleteriously influence the AFC operation.

However, the use of a constant voltage diode 4 in an AFC circuit not only adds to the expense of the circuit but the diode 4 is a source of noise and hence it is necessary that the capacitor 6 be of large capacitance for by-passing the noise signals. This also contributes to the expense of the circuit.

If a resistor is provide in place of the constant voltage diode 4, then changes in the power source voltage +Vcc result in changes in the reverse bias voltage for the varicap diode 3 so that drift may be produced in the oscillating frequency.

DESCRIPTION OF CERTAIN OF THE PREFERRED EMBODIMENTS

An embodiment of the present invention will be hereinbelow described with reference to FIG. 2 in which the reference numerals that are identical to the reference numerals in FIG. 1 identify the same elements.

Figure 2:
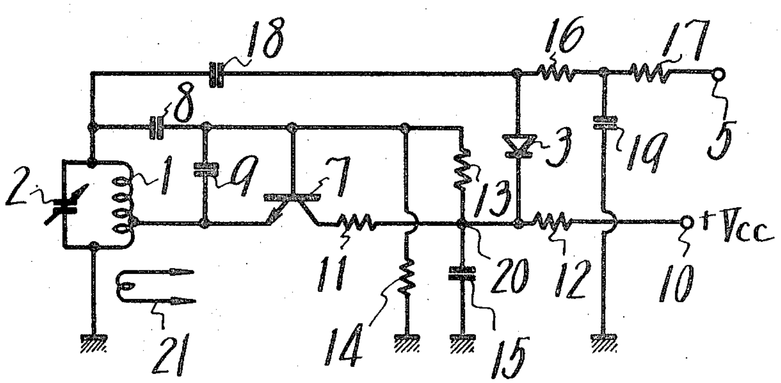
FIG. 2 is a circuit diagram representing one embodiment of the AFC circuit according to the present invention.

In the embodiment of FIG. 2, a modified Hartley oscillator is used as an oscillating circuit. The base electrode of a transistor 7 adapted for oscillation is connected to a source of reference potential such as ground, by a capacitor 8 and an L-C resonant circuit formed by the parallel connection of a coil 1 and a capacitor 2. The emitter electrode of the transistor 7 is connected to a mid-tap of the coil 1 and additionally, to its base electrode through a capacitor 9. The collector electrode of the transistor is connected by series resistors 11 and 12 to a power source terminal 10 adapted to be provided with energizing voltage +Vcc. The junction 20 between the resistors 11 and 12 is connected to the base electrode of the transistor 7 through a resistor 13. The base electrode of the transistor 7 is connected to ground by a resistor 14. One electrode of the varicap diode 3, such as the cathode, is connected to the junction 20 which is connected to ground by a capacitor 15. The other electrode of the varicap diode 3 is connected to the AFC voltage input terminal 5 by resistors 16 and 17 and is also connected to the L-C resonant circuit formed of coil 1 and capacitor 2 by a capacitor 18. The junction between the resistors 16 and 17 is connected to ground by a capacitor 19. The oscillating signal output is derived through a secondary coil 21 transformer coupled to the coil 1. The resistor 11 is used for reducing the scatter of the parameter of the transistor 7. If the resistance values of the resistors 11 and 12 are taken as $R_{11}$ and $R_{12}$, and if the condition $R_{11} << R_{12}$ is satisfied, the resistor 11 can be dispensed with.

Figure 3:
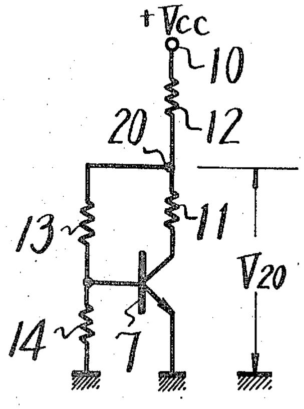
FIG. 3 is a schematic diagram for showing the interconnection of a portion of the circuit depicted in FIG. 2.

A DC equivalent circuit of the transistor 7 in the embodiment of FIG. 2 is represented in FIG. 3. A DC negative feedback path is provided between the collector and base electrode of the transistor 7. This feedback path is seen to comprise the resistor 11, which admits of a relatively small resistance value, and the resistor 13. Hence the DC voltage $V_{20}$ at the junction 20 is substantially constant irrespective of variations or changes in the power source voltage +Vcc. The mid-tap of coil 1 provides a DC path to ground for the emitter electrode of the transistor. In this circuit, since one electrode of the varicap diode 3 is connected to the junction 20, the varicap diode is supplied with a constant reverse bias voltage. It is seen that the varicap diode 3 is connected in AC parallel relationship to the coil 1 and the capacitor 2 by the capacitors 18 and 15, so that when an AFC voltage is applied to the input terminal 5, the varicap diode is reverse biased by the bias voltage at the junction 20 and the AFC operation is performed.

Figure 4:
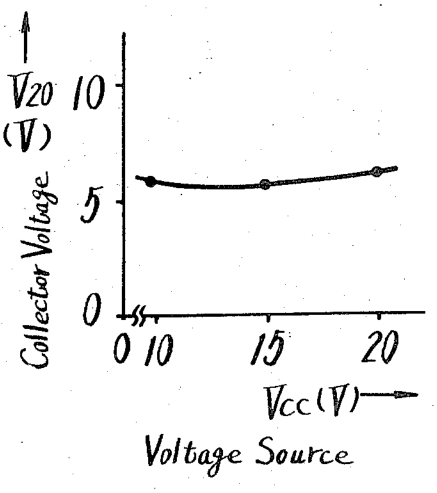
FIG. 4 is a graphical representation of the reverse bias voltage -power source voltage characteristic of the embodiment shown in FIG. 2.
Figure 5:
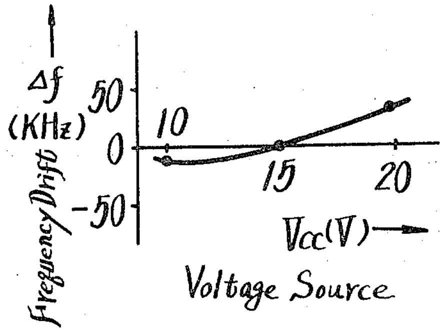
FIG. 5 is a graphical representation of the oscillation frequency drift-power source voltage characteristic of the embodiment shown in FIG. 2.

As is apparent from FIGS. 4 and 5, which graphically represent the affects of changes in the power source voltage Vcc on the reverse bias voltage $V_{20}$ for the varicap diode 3 and the affects of changes in the power source voltage Vcc on the oscillation frequency (its center frequency is, for example, 108.7MHz) drift, respectively, the stability of the reverse bias voltage $V_{20}$ is substantially the same as that of a constant voltage source. Thus, a stable oscillation output can be obtained.

Consequently, the AFC circuit of the present invention need not be provided with a relatively expensive constant voltage diode and a capacitor of large capacitance value which have heretofore been used in prior art AFC circuits of the type shown in FIG. 1. Thus, the present AFC circuit is simple and inexpensive while providing stable and positive AFC operation.

Figure 6:
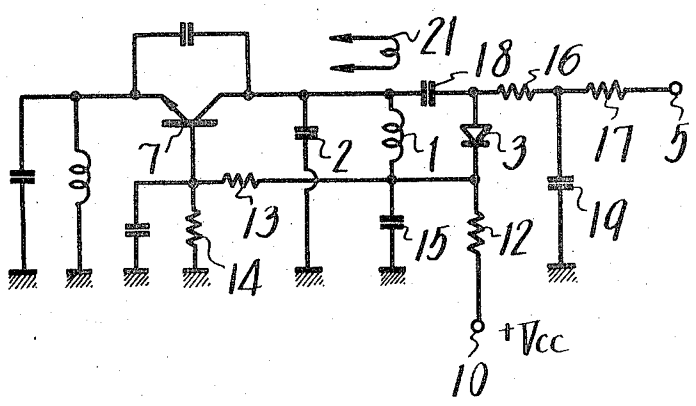
FIG. 6 is a circuit diagram representing another embodiment of the AFC circuit of the present invention.

FIG. 6 illustrates another embodiment of the present invention in which like reference numerals are used, as in the foregoing Figures, to identify corresponding elements.

In FIG. 6, the transistor 7 is connected to the coil 1 and the capacitor 2 to form a modified Colpitts oscillator. It is appreciated that the coil 1 exhibits a relatively low DC resistance value. Hence, a DC negative feedback path is provided between the collector and base electrodes of the transistor comprising the coil 1 and the resistor 13. Also, the collector electrode of the transistor is connected by the coil and the resistor 12 to the power source terminal 10. As is illustrated, the cathode electrode of the varicap diode 3 is coupled to the collector electrode of the transistor 7. Accordingly, a substantially constant reverse bias voltage is applied to the varicap diode by the collector electrode in a manner similar to that described hereinabove with respect to the embodiment depicted in FIGS. 2 and 3. Stable and positive AFC operation is obtained in response to the application of an AFC voltage to the input terminal 5. As may be observed, the varicap diode is connected in AC parallel relationship to the coil 1 and the capacitor 2 by the capacitors 18 and 15. The oscillating output signal is derived from the signal produced by the coil 1 and may be obtained from the secondary coil 21 transformer coupled to the coil 1.

It may be apparent that many variations and modifications can be effected without departing from the spirit and scope of the novel concepts on the present invention. It is therefore intended that the appended claims be interpreted as including all such variations and modifications.

What is claimed is:

1. An automatic frequency control circuit, comprising:

an L-C resonant circuit;

a transistor connected to said L-C resonant circuit to thereby form an oscillator circuit, said transistor including a collector electrode connected to the base electrode thereof by a DC feedback path;

a source of energizing potential coupled to the collector electrode of said transistor by first resistance means for supplying an energizing potential thereto;

varicap diode means connected in AC parallel relationship to the capacitance means of said L-C resonant circuit, said varicap diode means being further connected to the collector electrode of transistor to receive a reverse bias voltage therefrom; and means for supplying a frequency controlling signal to said varicap diode means to vary the capacitance thereof, whereby the oscillating frequency of said oscillating circuit is correspondingly varied.

2. An automatic frequency control circuit in accordance with claim 1 wherein said transistor is connected to said L-C resonant circuit to form a Hartley-type oscillator circuit and wherein the DC feedback path interconnecting the collector and base electrodes of the transistor comprises second resistance means.

3. An automatic frequency control circuit in accordance with claim 2 further including signal output means transformer coupled to the inductance means of said L-C resonant circuit; and a control signal input terminal coupled to said varicap diode means to receive said frequency controlling signal.

4. An automatic frequency control circuit in accordance with claim 1 wherein said transistor is connected to said L-C resonant circuit to form a Colpitts-type oscillator circuit.

5. An automatic frequency control circuit in accordance with claim 4 further including signal output means comprising a first inductor and a first capacitor connected in series between the collector electrode of said transistor and a source of reference potential, wherein an output signal is derived from the signal produced by said first inductor; and a control signal input terminal coupled to said varicap diode means to receive said frequency controlling signal.

* * * * *